(12) United States Patent
Hayashi (10) Patent No.: US 7,576,377 B2
(45) Date of Patent: Aug. 18, 2009

(54) FERROELECTRIC MEMORY DEVICE AND MANUFACTURING METHOD THEREOF

(75) Inventor: Takahisa Hayashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 295 days.

(21) Appl. No.: 11/441,195

(22) Filed: May 26, 2006

(65) Prior Publication Data

US 2006/0267057 A1 Nov. 30, 2006

(30) Foreign Application Priority Data

May 31, 2005 (JP) ............................. 2005-158586

(51) Int. Cl.
*H01L 21/8242* (2006.01)
(52) U.S. Cl. .............................. 257/295; 257/E27.104; 257/E21.664; 438/3
(58) Field of Classification Search ................. 257/295, 257/E43.001–E43.007, E27.005–E27.006, 257/E27.008, E29.164, E29.167, E29.272, 257/E29.323, E21.436, E21.663–E21.665, 257/E27.104; 438/3, 785

See application file for complete search history.

(56) References Cited

U.S. PATENT DOCUMENTS

| | | | | |
|---|---|---|---|---|
| 6,249,014 B1 * | 6/2001 | Bailey | ........................ | 257/295 |
| 6,469,333 B1 * | 10/2002 | Takai et al. | .................. | 257/295 |
| 6,509,601 B1 * | 1/2003 | Lee et al. | ..................... | 257/310 |
| 6,534,809 B2 * | 3/2003 | Moise et al. | ................. | 257/295 |
| 6,559,003 B2 * | 5/2003 | Hartner et al. | .............. | 438/241 |
| 6,570,203 B2 * | 5/2003 | Hikosaka et al. | ............ | 257/295 |
| 6,611,014 B1 * | 8/2003 | Kanaya et al. | .............. | 257/295 |
| 6,613,586 B2 * | 9/2003 | Bailey | ........................... | 438/3 |
| 6,617,626 B2 * | 9/2003 | Ozawa et al. | ............... | 257/295 |
| 6,734,477 B2 * | 5/2004 | Moise et al. | ................. | 257/295 |
| 6,737,694 B2 * | 5/2004 | Kim et al. | .................... | 257/296 |
| 6,737,697 B2 * | 5/2004 | Kutsunai et al. | ............ | 257/306 |
| 6,750,492 B2 | 6/2004 | Mikawa et al. | | |
| 6,784,474 B2 * | 8/2004 | Ogawa et al. | ............... | 257/295 |

(Continued)

FOREIGN PATENT DOCUMENTS

JP        2001-250922        9/2001

(Continued)

OTHER PUBLICATIONS

Yoshimasa Horii et al., Mbit Embedded FRA for High Performance System on Chip (SoC) With Large Switching Charge . . . ; IDEM Digest of Technical Papers; 2002; pp. 539-542.

(Continued)

*Primary Examiner*—W. David Coleman
*Assistant Examiner*—Maliheh Malek
(74) *Attorney, Agent, or Firm*—Volentine & Whitt, P.L.L.C.

(57) ABSTRACT

A ferroelectric memory device includes a semiconductor substrate, a first insulating film, a plurality of first and second plugs which extend through the first insulating film, conductive hydrogen barrier films, ferroelectric capacitor structural bodies, a first insulating hydrogen barrier film provided so as to cover the ferroelectric capacitor structural bodies, a second insulating film, local wirings extending on the second insulating film, a second insulating hydrogen barrier film which covers the local wirings, a third insulating film, third plugs which extend through the third insulating film so as to connect to their corresponding conductive hydrogen barrier films, and a first wiring layer extending on the third insulating film.

6 Claims, 5 Drawing Sheets

U.S. PATENT DOCUMENTS

| | | | |
|---|---|---|---|
| 6,906,367 B2* | 6/2005 | Matsuura et al. | 257/295 |
| 7,023,037 B2* | 4/2006 | Cho et al. | 257/295 |
| 7,183,602 B2* | 2/2007 | Udayakumar et al. | 257/295 |
| 7,235,834 B2* | 6/2007 | Fukada | 257/295 |
| 7,405,439 B2* | 7/2008 | Ichimori | 257/306 |
| 2002/0021544 A1* | 2/2002 | Cho et al. | 361/200 |
| 2002/0050627 A1* | 5/2002 | Zambrano | 257/532 |
| 2002/0127867 A1* | 9/2002 | Lee | 438/694 |
| 2003/0124748 A1* | 7/2003 | Summerfelt et al. | 438/3 |
| 2003/0148579 A1* | 8/2003 | Hikosaka et al. | 438/241 |
| 2005/0012126 A1* | 1/2005 | Udayakumar et al. | 257/295 |
| 2005/0054122 A1* | 3/2005 | Celii et al. | 438/3 |
| 2005/0230727 A1* | 10/2005 | Tamura et al. | 257/295 |
| 2006/0002170 A1* | 1/2006 | Kumura et al. | 365/145 |
| 2006/0033138 A1* | 2/2006 | Fukada | 257/296 |
| 2006/0073613 A1* | 4/2006 | Aggarwal et al. | 438/3 |
| 2006/0118841 A1* | 6/2006 | Eliason et al. | 257/295 |
| 2006/0138515 A1* | 6/2006 | Ozaki | 257/306 |
| 2006/0214208 A1* | 9/2006 | Wang | 257/295 |
| 2006/0223198 A1* | 10/2006 | Kikuchi et al. | 438/3 |
| 2006/0244025 A1* | 11/2006 | Yamanobe | 257/296 |
| 2006/0244031 A1* | 11/2006 | Ichimori | 257/306 |

FOREIGN PATENT DOCUMENTS

| | | |
|---|---|---|
| JP | 2002-252336 | 9/2002 |
| JP | 2003-68987 | 3/2003 |

OTHER PUBLICATIONS

Tatsuya Yamazaki et al.; Advanced 0.5um FRAM Device Technology With Full Compability of Half-Micron . . . ; IDEM Digest of Technical Papers; 1997; pp. 613-616.

* cited by examiner

FERROELECTRIC MEMORY DEVICE AND MANUFACTURING METHOD THEREOF

BACKGROUND OF THE INVENTION

The present invention relates to a ferroelectric memory device having memory cells each of which stores therein binarized data as a polarization state of a ferroelectric layer, and a manufacturing method thereof.

An FeRAM (Ferroelectric Random Access Memory) has been known as a so-called ferroelectric memory.

As one example of the ferroelectric memory, there has been known a configuration wherein an upper electrode of a capacitor including a ferroelectric layer and a W (tungsten)-plug connected to its corresponding elemental device are connected by a local wiring (refer to a non-patent document 1 (IEDM Digest of Technical papers. 1997, pp 613-616 (refer particularly to FIG. 1)).

There has also been known a configuration wherein a lower electrode of a capacitor including a ferroelectric layer and a W (tungsten)-plug connected to its corresponding elemental device are directly connected (refer to a non-patent document 2 (IEDM Digest of Technical papers. 2002, pp 539-542 (refer particularly to FIG. 3)).

A ferroelectric layer included in the FeRAM is formed of an oxygen compound material like so-called SBT ($SrBi_2Ta_2O_9$). The ferroelectric layer will cause a reduction reaction due to moisture ($H_2O$) inevitably mixed in, for example, a CVD film formed around the ferroelectric layer, and hydrogen ($H_2$) derived from the moisture or hydrogen evolved upon formation of each embedded contact (plug). Due to this reduction reaction, the polarization characteristic of the ferroelectric layer is degraded.

After the formation of the capacitor including the ferroelectric layer, heat treatment is generally done under an oxygen atmosphere for the purpose of recovering damage of the ferroelectric layer. At this time, however, there is a case where when the surface of the plug is being exposed, the plug is oxidized, so that faulty electrical continuity occurs.

With the objective of reducing damage of a ferroelectric film (layer) due to the spreading of hydrogen or moisture through contacts each extending to an upper electrode of a so-called ferroelectric memory, there has been known a method for manufacturing a semiconductor device wherein conductive hydrogen barrier films are formed after the formation of such contacts (refer to a patent document 1 (Japanese Unexamined Patent Publication No. 2002-252336)).

With a view toward to suppressing and preventing degradation of the characteristic of a memory cell capacitor due to hydrogen and a reductive atmosphere, there have been disclosed a semiconductor memory device wherein a first hydrogen barrier film for covering the side above the memory cell capacitor and a second hydrogen barrier film for covering the side below the memory cell capacitor are provided, and a method for manufacturing the same (refer to a patent document 2 (Japanese Unexamined Patent Publication No. 2003-68987)).

Further, with a view toward preventing faulty electrical continuity due to the oxidation of each plug, there has been known a configuration wherein an wiring on an upper electrode of a semiconductor device is connected to its corresponding plug via a conductor formed in the same process as one for a lower electrode of a ferroelectric capacitive element (refer to a patent document 3 (Japanese Unexamined Patent Publication No. 2001-250922)).

There may be cases in which even though each hydrogen barrier film for covering the upper or lower side of the capacitor including the ferroelectric layer is formed as disclosed in the patent documents 1 and 2, for example, hydrogen reaches the ferroelectric layer through the corresponding local wiring connected to the upper electrode of the capacitor, thus causing degradation of the ferroelectric layer. Since no large current flows in the local wirings in the ferroelectric memory having such local wirings as described in the non-patent document 1, TiN (titanium nitride) is generally applied as a wiring material.

The present TiN wiring is capable of absorbing or sucking and holding hydrogen of a certain degree of amount. When, however, the hydrogen exceeds its allowable amount, the TiN wiring discharges the absorbed hydrogen. That is, hydrogen existing inevitably outside the capacitor, which evolves upon the formation of each plug, for example, is brought to the ferroelectric capacitor through the TiN wiring even though the upper and lower sides of the capacitor are covered with the corresponding hydrogen barrier film, where a portion exposed outside the hydrogen barrier film exists in the TiN wiring. As a result, the ferroelectric layer is degraded.

SUMMARY OF THE INVENTION

The present invention has been made in view of the problems related to the above related arts. That is, an object of the present invention is to provide a ferroelectric memory having such a configuration as to be capable of effectively preventing degradation of a ferroelectric layer due to hydrogen, moisture, a reduction atmosphere, etc. and faulty electrical continuity due to the oxidation of a plug in addition to the above.

In order to attain the above object, a ferroelectric memory device of the present invention includes such configurations as shown below.

That is, the ferroelectric memory device is provided with a semiconductor substrate having a memory cell array area and a logic circuit area.

The ferroelectric memory device includes a first insulating film provided on the memory cell array area and the logic circuit area.

The ferroelectric memory device includes a plurality of first plugs extending through the first insulating film in the memory cell array area, and a plurality of second plugs extending through the first insulating film in the logic circuit area.

The ferroelectric memory device is provided, on the first insulating film, with a plurality of conductive hydrogen barrier films which individually cover top faces of the plurality of first plugs.

The ferroelectric memory device is provided with ferroelectric capacitor structural bodies provided on parts of the plurality of conductive hydrogen barrier films lying in the memory cell array area, each ferroelectric capacitor structural body being formed by sequentially laminating a lower electrode, a ferroelectric layer and an upper electrode.

The ferroelectric memory device is provided with a first insulating hydrogen barrier film which is provided on the first insulating film in the memory cell array area so as to cover the ferroelectric capacitor structural bodies and the conductive hydrogen barrier films, and which has first apertures exposing parts of the upper electrodes and a second aperture exposing part of the corresponding conductive hydrogen barrier film.

The ferroelectric memory device includes a second insulating film provided on the first insulating hydrogen barrier film and having third apertures communicating with the first apertures and a fourth aperture communicating with the second aperture with each end edge portion of the first insulating hydrogen barrier film being exposed in a closed annular form as an exposed portion.

The ferroelectric memory device includes a plurality of local wirings which extend on the second insulating film, and which connect the upper electrodes exposed from the third apertures and the conductive hydrogen barrier film exposed from the fourth aperture, connect the upper electrodes to one another and connect the conductive hydrogen barrier films to one another.

The ferroelectric memory device includes a second insulating hydrogen barrier film provided on the memory cell array area so as to cover the exposed portion, a plurality of the local wirings and the second insulating film.

The ferroelectric memory device includes a third insulating film which covers the second insulating hydrogen barrier film and the logic circuit area.

The ferroelectric memory device is provided with third plugs provided in the logic circuit area and respectively extending through the third insulating film so as to electrically connect to the second plugs.

The ferroelectric memory device includes a first wiring layer which extends on the third insulating film and includes a plurality of wiring portions and which is connected to the third plugs.

A logic circuit mentioned herein is of a circuit which performs, for example, arithmetic computations and operational control related to each ferroelectric memory cell. The logic circuit includes a decoder circuit or the like which controls an electrical operation of the ferroelectric memory cell.

A method for manufacturing a ferroelectric memory device, according to the present invention mainly includes such steps as shown below.

That is, a semiconductor substrate having a memory cell array area in which a plurality of memory cell elements are provided in matrix form, and a logic circuit area provided with a logic circuit element is prepared.

A first insulating film is formed on the memory cell array area and the logic circuit area. A plurality of first plugs that extend through the first insulating film are formed in the memory cell array area. A plurality of second plugs extending through the first insulating film are formed in the logic circuit area.

Conductive hydrogen barrier films which individually cover top faces of the first plugs, are formed on the first insulating film.

Ferroelectric capacitor structural bodies in which lower electrodes, ferroelectric layers and upper electrodes are sequentially laminated, are formed on parts of the plurality of conductive hydrogen barrier films respectively.

A first insulating hydrogen barrier film, which covers the ferroelectric capacitor structural bodies and the conductive hydrogen barrier films and has first apertures exposing parts of the upper electrodes and a second aperture exposing part of the corresponding conductive hydrogen barrier film, is formed on the first insulating film in the memory cell array area.

A second insulating film having third apertures communicating with the first apertures and a fourth aperture communicating with the second aperture with each end edge portion of the first insulating hydrogen barrier film being exposed in a closed annular form as an exposed portion, is formed on the first insulating hydrogen barrier film.

A plurality of local wirings are formed which extend on the second insulating film and which connect the upper electrodes exposed from the third apertures and the conductive hydrogen barrier film exposed from the fourth aperture, connect the upper electrodes to one another and connect the conductive hydrogen barrier films to one another.

A second insulating hydrogen barrier film, which covers the exposed portion, a plurality of the local wirings and the second insulating film, is formed in the memory cell array area.

A third insulating film which covers the second insulating hydrogen barrier film from above and covers the logic circuit area, is formed. Third plugs, which respectively extend through the third insulating film so as to electrically connect to the second plugs, are formed in the logic circuit area.

A first wiring layer, which extends on the third insulating film and which is connected to the third plugs and includes a plurality of wiring portions, is formed.

According to the configuration of the ferroelectric memory device of the present invention, local wirings exist on their upper and lower sides respectively. The local wirings are sealed within areas partitioned by a plurality of hydrogen barrier films brought into closed bag forms as a whole by connecting their end edges to one another, i.e., they are encapsulated therein. Accordingly, there is no fear that each local wiring brings hydrogen inevitably existing within the device due to a manufacturing process like, for example, the formation of tungsten plugs, to a ferroelectric layer. That is, there is no fear that the ferroelectric layer is degraded. It is thus possible to provide a high-performance ferroelectric memory device free of degradation of an electrical characteristic and having a ferroelectric capacitor.

If such a configuration that the conductive hydrogen barrier films are provided even on top faces of all plugs is taken, then oxidation of each plug due to the manufacturing process can be prevented. That is, faulty electrical continuity of each plug can be prevented.

According to a method for manufacturing the ferroelectric memory device of the present invention, such a ferroelectric memory device as to have the above configuration can efficiently be manufactured in a simple process.

Even in the case of such a configuration that all the plugs are covered with the conductive hydrogen barrier films, an increase in the number of process steps is avoided and an efficient ferroelectric memory device can be manufactured.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. Incidentally, be cognizant of the fact that respective constituent elements in the figures are merely approximate illustrations to enable an understanding of the present invention, and that the numerical conditions explained below are nothing more than mere examples.

First Preferred Embodiment (Configurational Example of Ferroelectric Memory Device)

One configurational example of a ferroelectric memory device according to the present invention will be explained with reference to FIG. 1.

Figure 1:
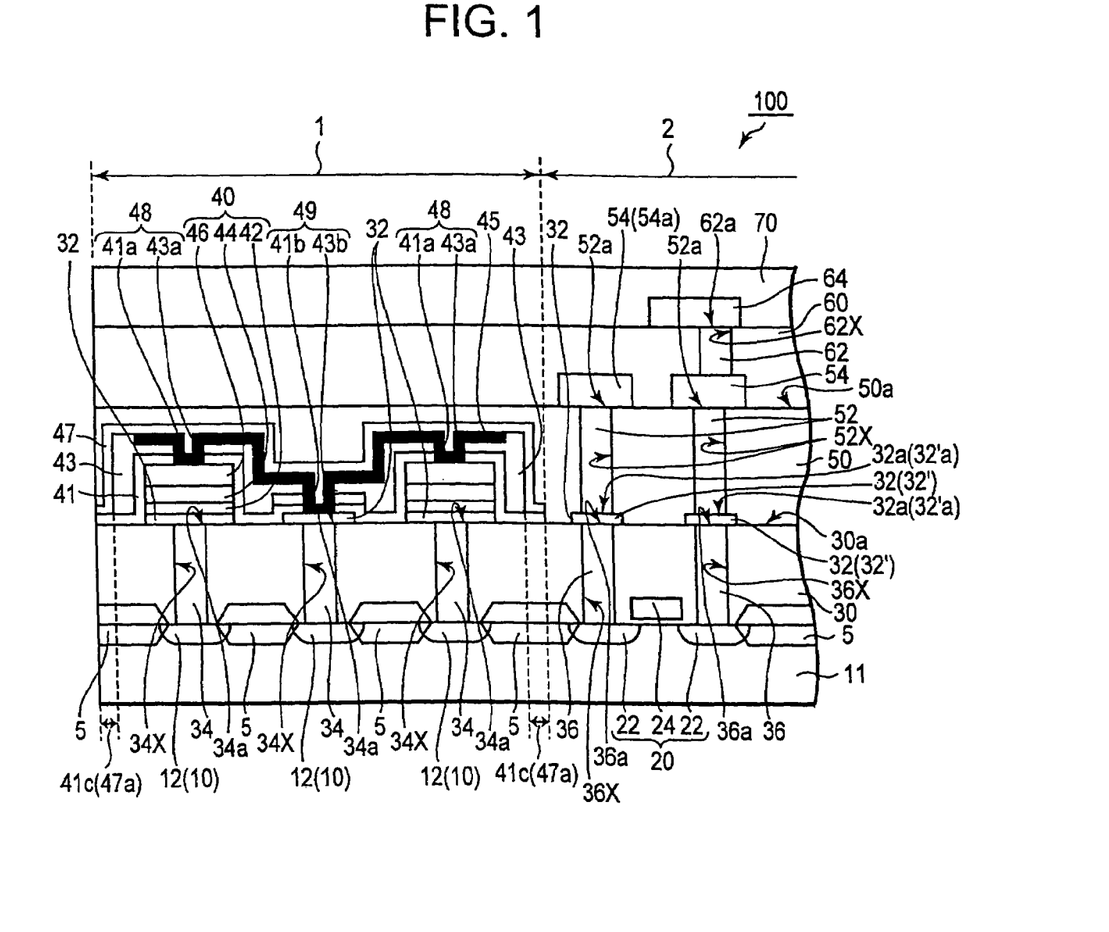
FIG. 1 is a typical view showing a partly-cutaway partial section of a ferroelectric memory device according to the present invention.

FIG. 1 is a typical view showing a partly-cutaway partial section of the ferroelectric memory device according to the present invention.

The ferroelectric memory device 100 according to the present invention is characterized by the constitution of an insulating hydrogen barrier film to be described later. As other constituent elements, arbitrary and suitable constituent elements of a conventional known ferroelectric memory device can be suitably selected and applied.

As shown in FIG. 1, the ferroelectric memory device 100 includes a semiconductor substrate 11. The semiconductor substrate 11 is compartmentalized by a memory cell array area 1 and a logic circuit area 2 adjacent to the memory cell array area 1.

The term "area" mentioned herein means a three-dimensional area containing constituent elements provided over the semiconductor substrate 11.

The memory cell array area 1 is provided with memory cell elements 10. Further, the logic circuit area 2 is provided with a logic circuit element 20. The memory cell elements 10 and logic circuit element 20 are separated from one another by a device isolation structure formed by a conventional known device isolation process, e.g., a field oxide film 5 formed by a LOCOS method.

The memory cell array area 1 is adjacent to the logic circuit area 2. While a plurality of memory cells each containing a ferroelectric layer to be described later and the memory cell elements are provided in the memory cell array area 1 in matrix form, an area including two ferroelectric laminated structures (capacitors) will be explained by way of illustration.

The memory cell element 10 is of, for example, a switch transistor or the like and has a configuration known to date. While only each of memory cell element diffusion regions 12 is shown in the illustrated example as, for example, a constituent element for a transistor, the memory cell element 10 has an unillustrated gate electrode or the like.

The memory cell element diffusion region 12 is of an ion diffusion region in which arbitrary and suitable ions are implanted under conventional known conditions, for example.

The logic circuit area 2 is adjacent to the memory cell array area 1. The logic circuit element 20 is formed in the logic circuit area 2.

The logic circuit element 20 includes an element such as a transistor in a manner similar to the memory cell element 10. The logic circuit element 20 includes a decoder circuit or the like which is connected to a memory cell array and controls the operation of each memory cell.

The logic circuit element 20 has logic circuit element diffusion regions 22 and a logic circuit element gate electrode 24 as constituent elements of a transistor, for example.

The logic circuit element diffusion region 22 is of an ion diffused region in which arbitrary and suitable ions are implanted under conventional known conditions, for example. The logic circuit element gate electrode 24 is a metal electrode known to date, for example.

A first insulating film 30 is provided over the memory cell array area 1 in which the memory cell elements 10 are built, and the logic circuit area 2 in which the logic circuit element 20 is built. That is, the first insulating film 30 is provided over the entire upper surface of the semiconductor substrate 11 formed with the memory cell elements 10 and the logic circuit element 20. The first insulating film 30 may preferably be formed as a silicon oxide film (hereinafter called also simply "$O_3$-TEOS film") deposited or grown by, for example, a plasma CVD method with TEOS as a material, using ozone ($O_3$).

First contact holes 34X provided in the memory cell array area 1 and second contact holes 36X provided in the logic circuit area 2 are defined in the first insulating film 30. The first contact hole 34X extends from the surface 30a of the first insulating film 30 to the memory cell element 10 (memory cell element diffusion region 12). The second contact hole 36X extends from the surface 30a of the first insulating film 30 to the logic circuit element 20 (logic circuit element diffusion region 22 and logic circuit element gate electrode 24).

For instance, tungsten (W) is embedded in each first contact hole 34X, which is formed as a first plug 34.

Similarly, a conductive material is embedded in each second contact hole 36X, which is formed as a second plug 36.

Conductive hydrogen barrier films 32 are provided on the first insulating film 30. Each of the conductive hydrogen barrier films 32 may preferably be formed as, for example, a film of titanium aluminum nitride (TiAlN). The conductive hydrogen barrier films 32 are provided over top faces 34a and 36a of the first and second plugs 34 and 36 as being patterned into a plurality of patterns which individually cover the top faces 34a and 36a of the first and second plugs 34 and 36 and have shapes extending to the surface 30a of the first insulating film 30. Thus, if the conductive hydrogen barrier film 32 is formed even on the top face 36a of each second plug 36, although the details thereof will be described later, it is then possible to prevent oxidation of the second plugs 36. Accordingly, the conductive hydrogen barrier films 32 provided on such a region are also called "antioxidant films 32'".

Ferroelectric capacitor structural bodies 40 are provided over the plurality of conductive hydrogen barrier films 32 lying in the memory cell array area 1. The ferroelectric capacitor structural bodies 40 are provided over some of the plurality of conductive hydrogen barrier films 32. In the illustrated example, the ferroelectric capacitor structural bodies 40 are provided over their corresponding conductive hydrogen barrier films 32 on both sides except for the conductive hydrogen barrier film 32 located in the center, of the conductive hydrogen barrier films 32 respectively independently provided over the top faces 34a of the three first plugs 34.

The ferroelectric capacitor structural body 40 has a configuration known to date. That is, the ferroelectric capacitor structural body 40 has a structure in which a lower electrode 42, a ferroelectric layer 44 and an upper electrode 46 are sequentially laminated.

The lower electrode 42 may preferably be configured as, for example, a laminated electrode formed by sequentially laminating an iridium (Ir) layer directly provided on the corresponding conductive hydrogen barrier film 32, then an iridium oxide (IrO$_2$) layer and further a platinum (Pt) layer. The ferroelectric layer 44 may preferably be configured as an SBT (SrBi$_2$Ta$_2$O$_9$) film. The upper electrode 46 may preferably be formed of, for example, platinum (Pt).

The conductive hydrogen barrier film 32 with each ferroelectric capacitor structural body 40 placed thereon is formed so as to coincide with a plane contour of the ferroelectric capacitor structural body 40, i.e., a plane shape of the lower electrode 42.

A first insulating hydrogen barrier film 41 covers exposed surfaces of the conductive hydrogen barrier films 32 and capacitor structural bodies 40 both lying in the memory cell array area 1 and is provided astride the surface 30a of the first insulating film 30. The first insulating hydrogen barrier film 41 may preferably be formed as, for example, a film of aluminum oxide (alumina: Al$_2$O$_3$).

The first insulating hydrogen barrier film 41 is provided so as to integrally cover a plurality of the ferroelectric capacitor structural bodies 40 provided in matrix form in the memory cell array area 1. That is, the first insulating hydrogen barrier film 41 is provided over the entire surface of the memory cell array area 1.

The ferroelectric capacitor structural bodies 40 are surrounded by and sealed with the first insulating hydrogen barrier film 41 and the already-described conductive hydrogen barrier films 32.

A first opening or aperture 41a that exposes part of the upper electrode 46, and a second opening or aperture 41b that exposes part of the conductive hydrogen barrier film 32 unprovided with the ferroelectric capacitor structural body 40 are defined in the first insulating hydrogen barrier film 41.

A second insulating film 43 is provided on the first insulating hydrogen barrier film 41. The second insulating film 43 may preferably be formed as a silicon oxide film formed by a conventional known CVD method, for example. The second insulating film 43 is provided in such a manner that each end edge portion 41c of the first insulating hydrogen barrier film 41 is exposed. The end edge portion 41c is also called "exposed portion (41c)" below. Thus, the end edge portion 41c exposed from the second insulating film 43 has a contiguous closed annular shape extending along an end edge of a plane contour of the first insulating hydrogen barrier film 41.

Third openings or apertures 43a, which communicate with their corresponding first openings 41a of the first insulating hydrogen barrier film 41, and fourth openings or apertures 43b, which communicate with their corresponding second openings 41b thereof, are defined in the second insulating film 43. That is, the third aperture 43a extends to the upper electrode 46, and the fourth aperture 43b extends to the upper surface 32a of the conductive hydrogen barrier film 32. The first aperture 41a and the third aperture 43a are also generally called "a first memory cell contact hole 48", and the second aperture 41b and the fourth aperture 43b are also generally called "a second memory cell contact hole 49".

Local wirings 45 respectively including a plurality of wiring sections or portions are provided on the second insulating film 43. The local wiring 45 is a wiring layer provided only within the memory cell array area 1. The local wiring 45 may preferably be constituted as a wiring with, for example, titanium nitride (TiN) as a material.

The plurality of wiring portions that constitute the local wirings 45 electrically connect the upper electrodes 46 of the ferroelectric capacitor structural bodies 40 to one another or electrically connect the upper electrodes 46 and the conductive hydrogen barrier film 32, i.e., the first plug 34 unprovided with the ferroelectric capacitor structural body 40. In the illustrated example, a wiring section or portion is shown which electrically connects the upper electrodes 46 of the two ferroelectric capacitor structural bodies 40 and the conductive hydrogen barrier film 32 located between these. Thus, the shapes (wiring patterns) of the wiring portions contained in each local wiring 45 can be constituted as arbitrary and suitable ones corresponding to desired connection relations.

The wiring portions of the local wiring 45 are extended so as to bury the first memory cell contact holes 48 and second memory cell contact hole 49 described above. Thus, the local wiring 45 electrically connect the upper electrodes 46 to each other or electrically connect the upper electrodes 46 and the conductive hydrogen barrier film 32.

A second insulating hydrogen barrier film 47, which covers the local wirings 45 and the second insulating film 43 on which the local wirings 45 extend, is provided on the local wirings 45. The second insulating hydrogen barrier film 47 is provided within the memory cell array area 1 and its each end edge portion 47a coincides with the end edge portion 41c of the first insulating hydrogen barrier film 41, which are exposed from the second insulating film 43. That is, the end edge portion 47a of the second insulating hydrogen barrier film 47 is connected in contact with its corresponding end edge portion 41c exposed from the second insulating film 43.

The second insulating film 43 and each local wiring 45 extending on the second insulating film 43 are surrounded by the first and second insulating hydrogen barrier films 41 and 47 except for portions where the first and second apertures 41a and 41b are provided. The ferroelectric capacitor structural body 40 is surrounded by the first insulating hydrogen barrier film 41 and the conductive hydrogen barrier film 32 except for the portions where the first and second apertures 41a and 41b are provided.

At this time, the upper sides of the local wirings 45 and the second insulating film 43 are perfectly covered with the second insulating hydrogen barrier film 47. The end edge portion 47a is connected to its corresponding end edge portion 41c of the first insulating hydrogen barrier film 41 with no space therebetween. The conductive hydrogen barrier film 32 perfectly covers the lower side of each ferroelectric capacitor structural body 40, and its end edge portion is connected to the first insulating hydrogen barrier film 41 with no space.

As a result, the ferroelectric capacitor structural bodies 40, the second insulating film 43 and each local wiring 45 are surrounded by and sealed with three constituent elements of the conductive hydrogen barrier films 32 and the first and second insulating hydrogen barrier films 41 and 47.

Thus, if such a configuration is taken, then each local wiring 45 is not brought into contact with a film (layer) which evolves hydrogen. That is, there is no fear that the local wiring 45 brings hydrogen to, particularly, the ferroelectric layer 44 of the ferroelectric capacitor structural body 40 connected to the local wiring 45.

A third insulating film 50 is provided so as to cover the memory cell array area 1 including the first and second insulating hydrogen barrier films 41 and 47 and the logic circuit area 2 including the conductive hydrogen barrier films 32, i.e., the antioxidant films 32' provided on the first insulating film 30. The third insulating film 50 is provided over the memory cell array area 1 and the logic circuit area 2. The third insulating film 50 may preferably be constituted as, for example, a silicon oxide film.

The third insulating film 50 is provided with third contact holes 52X. The third contact holes 52X are provided in the logic circuit area 2. The third contact holes 52X are provided so as to extend from a surface 50a of the third insulating film 50 to parts of upper surfaces 32'a of the antioxidant films 32'.

The third contact holes 52X are buried by a conductive material such as tungsten or the like to form third plugs 52. A top face 52a of each third plug 52 is aligned flush with the surface 50a of the third insulating film 50.

A first wiring layer 54 is provided on the top faces 52a of the third plugs 52 and the surface 50a of the third insulating film 50. The first wiring layer 54 contains a plurality of wiring sections or portions 54a and is electrically connected to the third plugs 52.

The first wiring layer 54 may preferably be constituted as a metal wiring like, for example, aluminum (Al), copper (Cu) or the like.

There is provided a multilayered wiring structure containing second and third wiring layers on the upper side as viewed from the first wiring layer 54 with the first wiring layer 54 as a first layer.

For example, a fourth insulating film 60 is provided on the third insulating film 50 so as to cover the first wiring layer 54. There is provided a via hole 62X which extends from the surface of the fourth insulating film 60 to the first wiring layer 54. A conductive material such as tungsten or the like is embedded in the via hole 62X to obtain a fourth plug 62. A top face 62a of the fourth plug 62 is aligned flush with the surface of the fourth insulating film 60.

A second wiring layer 64 containing a plurality of wiring sections or portions is provided on the top face 62a and the fourth insulating layer 60. That is, the second wiring layer 64 is connected to the first wiring layer 54 corresponding to a layer located therebelow by the fourth plug 62.

Preferred Modification

A further configurational example of a ferroelectric memory device according to the present invention will be explained with reference to FIG. 2.

Figure 2:
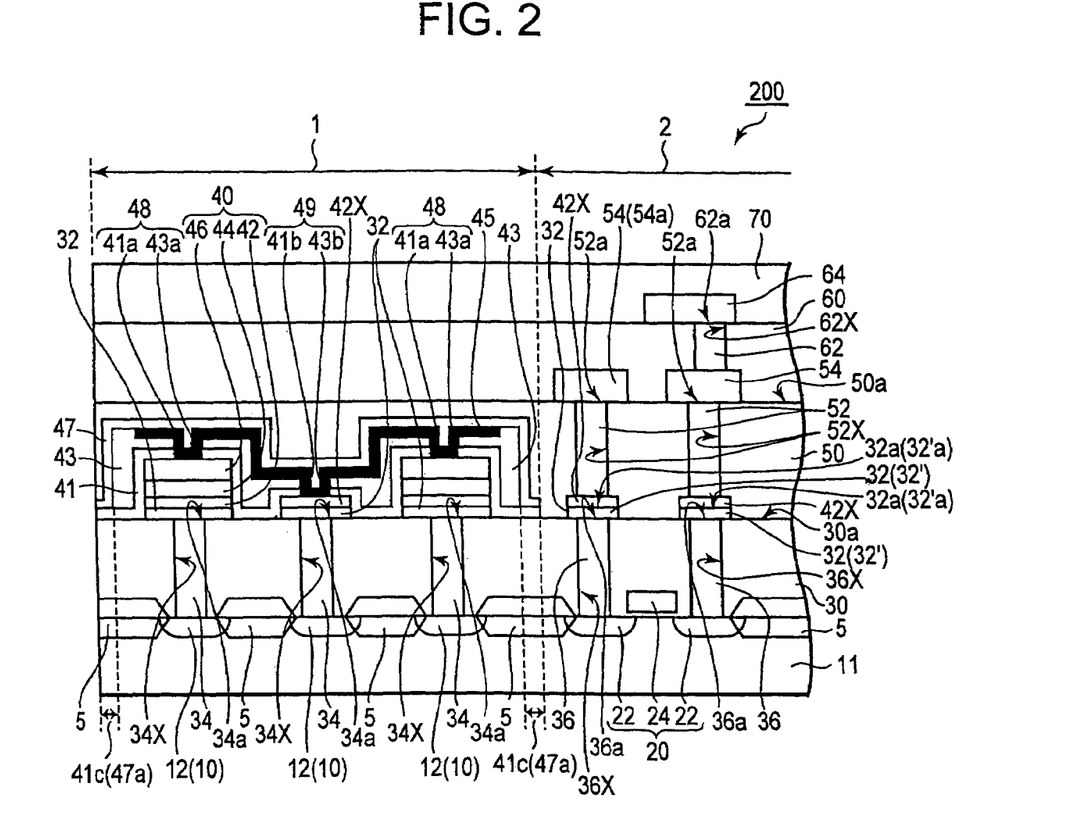
FIG. 2 is a typical view illustrating a partly-cutaway partial section of a ferroelectric memory device according to a modification.

FIG. 2 is a typical view illustrating a partly-cutaway partial section of the ferroelectric memory device (modification) according to the present invention.

The ferroelectric memory device 200 according to the present example is characterized by having a second antioxidant film 42X. Other constituent elements other than the above substantially remain unchanged with respect to the configurational example already described with reference to FIG. 1. Accordingly, the constituent elements are given like reference numerals, and their detailed explanations will be omitted.

The second antioxidant film 42X is provided on each antioxidant film 32'. The second antioxidant film 42X may be formed of the same material as each of lower electrodes 42.

Even in the case of such a configuration, it is possible to effectively prevent oxidation of each second plug 36 while deterioration of each ferroelectric capacitor structural body 40 due to hydrogen is being prevented.

(Method for Manufacturing Ferroelectric Memory Device)

An embodiment illustrative of a method for manufacturing the above ferroelectric memory device 100 will be explained below with reference to FIGS. 3, 4 and 5.

Incidentally, a partial area of a further part of one ferroelectric memory device of a large number of ferroelectric memory devices simultaneously formed in one wafer will be described by figures in a manner similar to FIGS. 1 and 2 in order to avoid complication of illustrations in the description of the one embodiment of the manufacturing method according to the present invention.

Constituent elements similar to those of the conventional ferroelectric memory device or ferroelectric memory, of the ferroelectric memory device according to the present invention can be implemented in a manner similar to their manufacturing process.

Figure 3A:
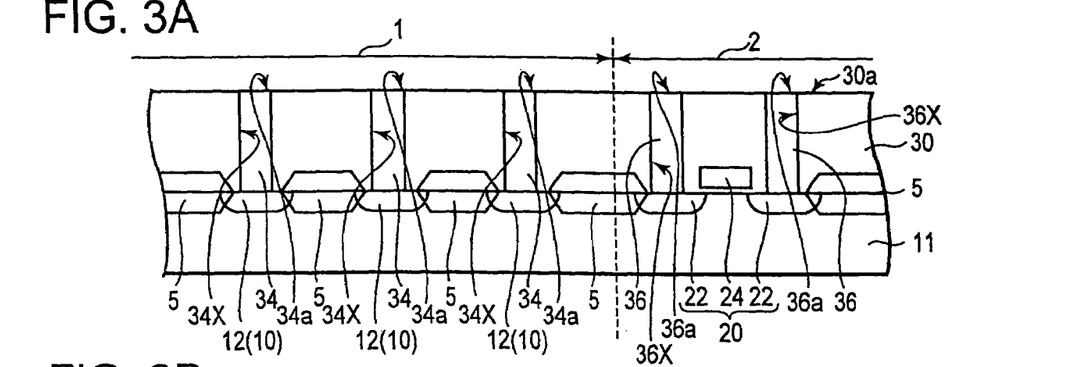
FIGS. 3(A), 3(B) and 3(C) are respectively schematic manufacturing process views showing a ferroelectric memory device placed midway through its manufacture at a wafer level in the form of a cutaway section.
Figure 3B:
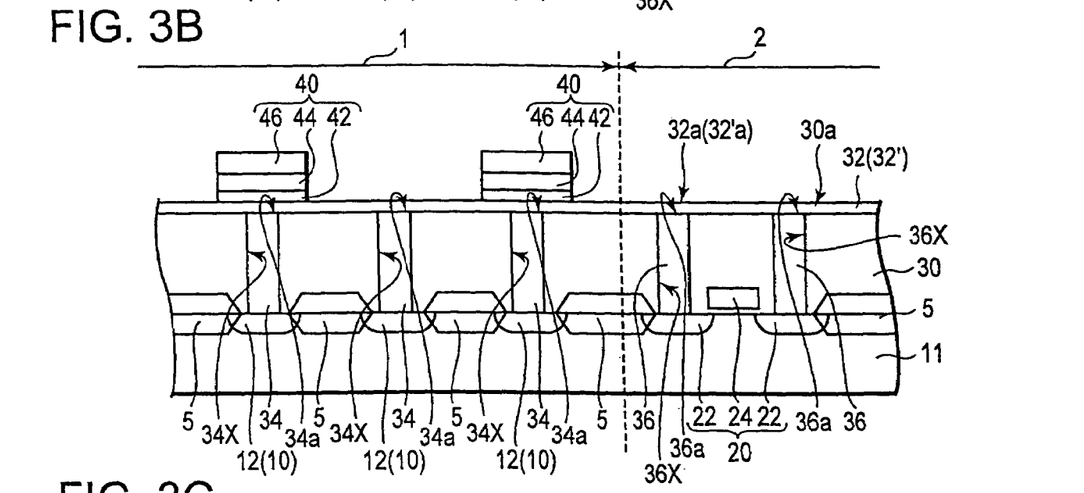
Figure 3C:
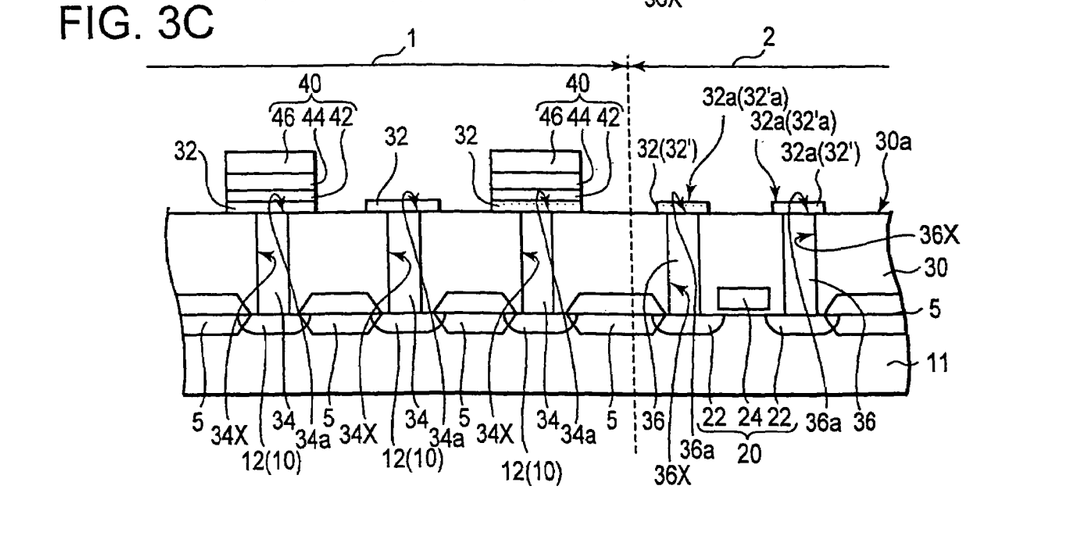

FIGS. 3(A), 3(B) and 3(C) are respectively schematic manufacturing process views showing, in cut sections, the ferroelectric memory device placed in the course of its production at a wafer level.

Figure 4A:
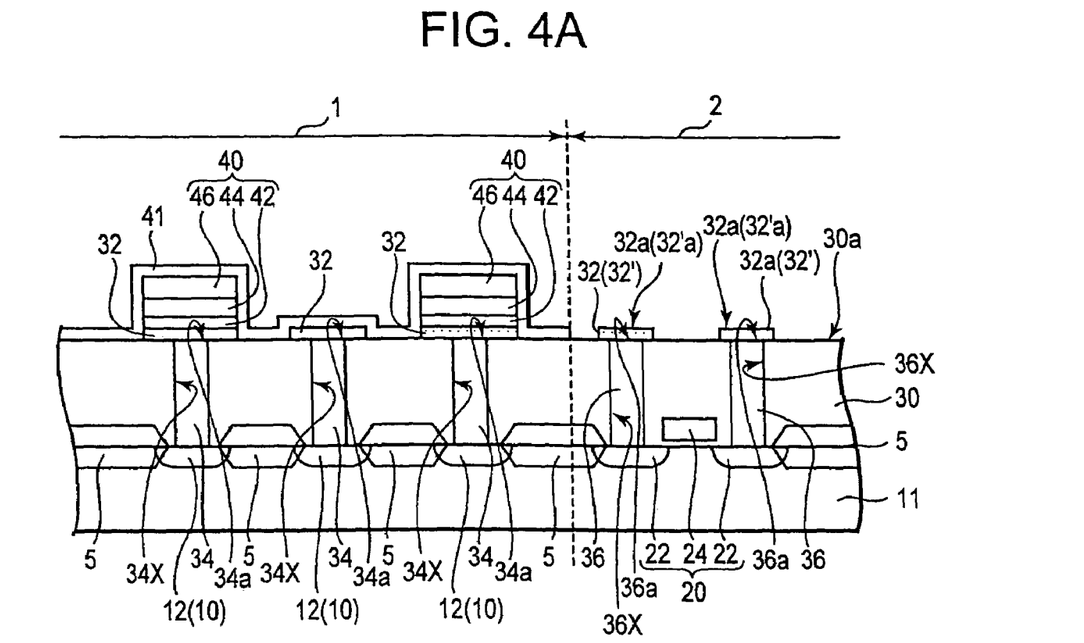
FIGS. 4(A) and 4(B) are respectively manufacturing process views following FIG. 3(C)
Figure 4B:
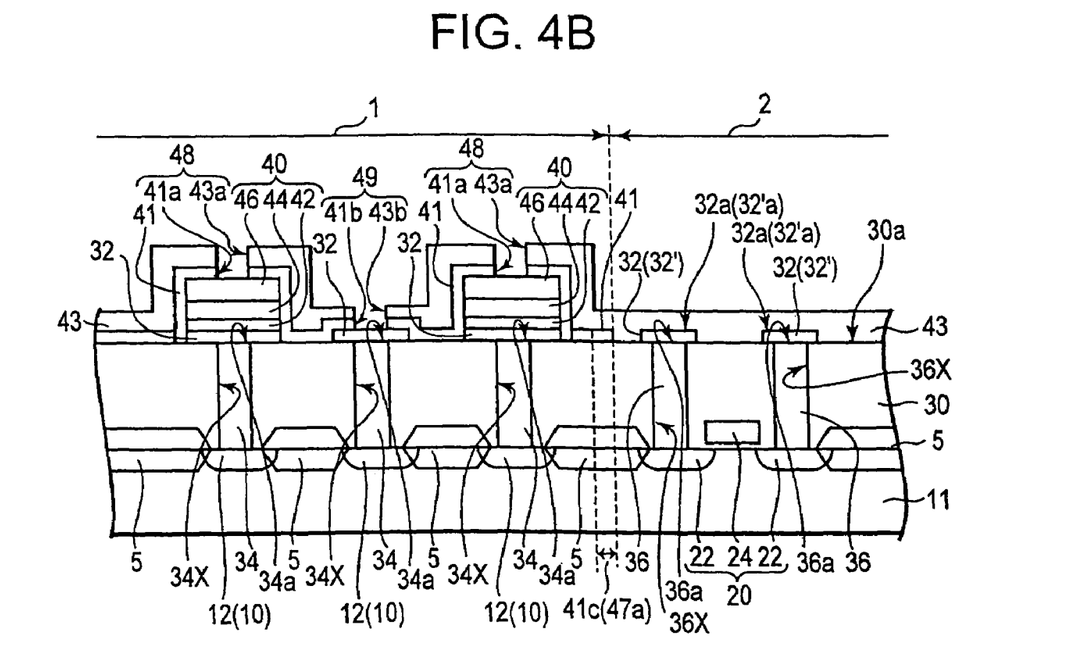

FIGS. 4(A) and 4(B) are respectively manufacturing process views following FIG. 3(C).

Figure 5A:
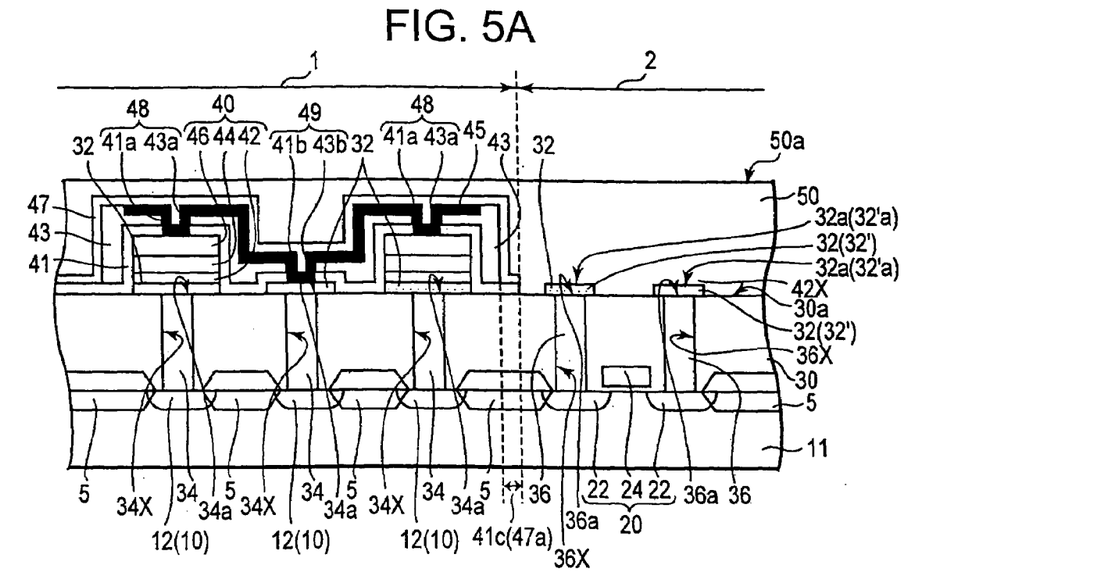
FIGS. 5(A) and 5(B) are respectively manufacturing process views following FIG. 4(B).
Figure 5B:
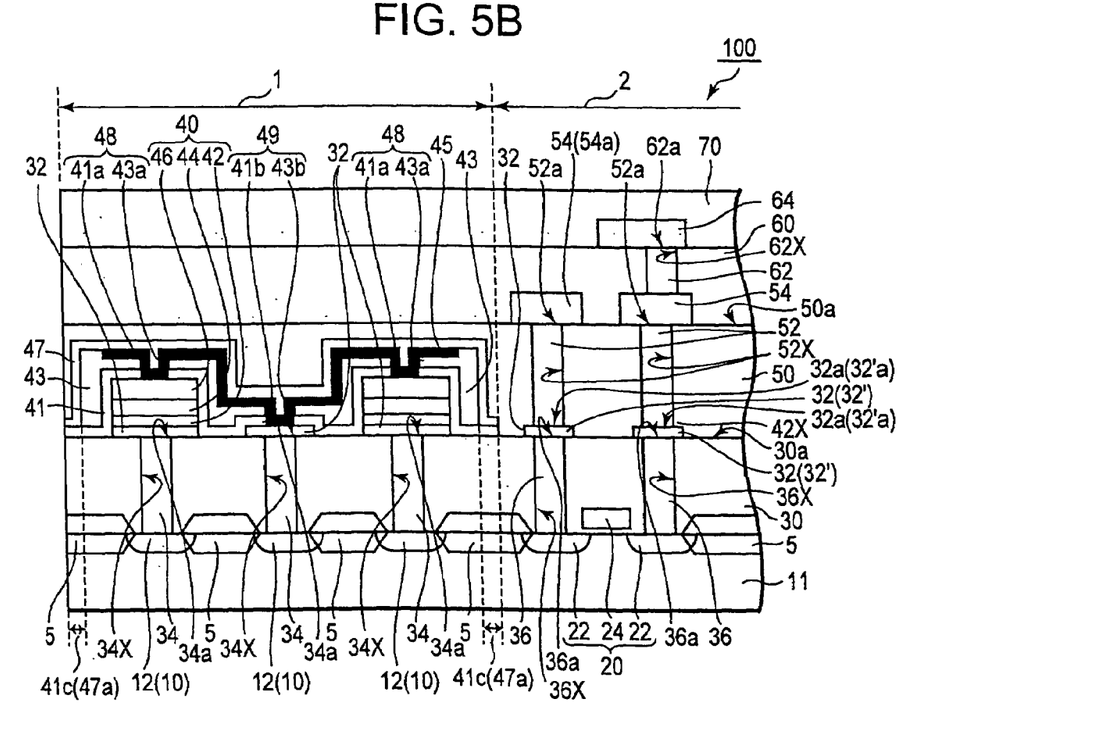

FIGS. 5(A) and 5(B) are respectively manufacturing process views following FIG. 4(B).

As shown in FIG. 3(A), memory cell array areas 1 and logic circuit areas 2 adjacent to the memory cell array areas 1 are partitioned on a semiconductor substrate (wafer) 11 as plural sets in matrix form with the memory cell array area 1 and the logic circuit area 2 adjacent thereto as one pair.

In accordance with the conventional known wafer process, memory cell elements 10 are built in the memory cell array area 1 of the semiconductor substrate 11 and at the same time a logic circuit element 20 is similarly built even in the logic circuit area 2.

Described specifically, a field oxide film 5, i.e., a device isolation structure is formed by, for example, a LOCOS method.

Next, memory cell elements 10 including memory cell element diffusion regions 12 corresponding to constituent elements of a transistor or the like are built in the memory cell array region 1. Similarly, a logic circuit element 20 is built even in the logic circuit area 2 simultaneously with the above.

Next, a first insulating film 30 is grown or deposited over the upper entire surface of the semiconductor substrate 11 including the memory cell array area 1 with the memory cell elements 10 built therein and the logic circuit area 2 with the logic circuit element 20 built therein.

Described specifically, a process for depositing the first insulating film 30 may be carried out by the conventional known plasma CVD method wherein, for example, ozone ($O_3$) is used and TEOS is used as a material.

Next, first and second contact holes 34X and 36X are defined in the first insulating film 30. These contact holes may be formed by the conventional known photolithography process and etching process.

Next, the first and second contact holes 34X and 36X are buried using a conductive material like, for example, tungsten (W) by a method known per se in the art, after which an etchback process is effected thereon to form first and second plugs 34 and 36.

As shown in FIG. 3(B), a conductive hydrogen barrier film 32 is deposited over the upper entire surface of the first insulating film 30. This deposition process may be carried out by the conventional known sputter process in accordance with the method known per se in the art. The conductive hydrogen barrier film 32 is preferably constituted as, for example, a film of titanium aluminum nitride (TiAlN). Its thickness may preferably be 50 nm or so.

Next, ferroelectric capacitor structural bodies 40 are formed within the memory cell array area 1 and on the conductive hydrogen barrier film 32 in accordance with the method known per se in the art.

Described specifically, lower electrodes 42, ferroelectric layers 44 and upper electrodes 46 are sequentially deposited and laminated using the already-described film materials.

As shown in FIG. 3(C), the conductive hydrogen barrier film 32 is patterned in accordance with the method known per se in the art. As to this patterning, the conductive hydrogen barrier film 32 is patterned into such shapes as to be placed over the corresponding top faces 34a and 36a of the first and second plugs 34 and 36, cover these and spread up to the periphery of the surface 30a of the first insulating film 30. At this time, as to the portions where the ferroelectric capacitor structural bodies 40 are provided, the conductive hydrogen barrier film 32 is patterned in alignment with a plane contour of the lower electrode 42 of each ferroelectric capacitor structural body 40.

According to this process, the conductive hydrogen barrier films 32 of the memory cell array area 1 and antioxidant films 32' of the logic circuit area 2 are formed.

A so-called recovery anneal process step for recovering deterioration of the ferroelectric layers 44 is now performed. This process is carried out by heat treatment at 800° C. for 1 minute under an oxygen atmosphere, for example. Upon the execution of the recovery anneal process step in the manufacturing process of the present invention, the top faces 34a and 36a of the first and second plugs 34 and 36 are protected by their corresponding conductive hydrogen barrier films 32 without exposing the top faces 34a and 36a of the first and second plugs 34 and 36. It is thus possible to prevent oxidation of the plugs due to the recovery anneal process step.

Prior to the patterning process step of the conductive hydrogen barrier film 32 provided over the upper entire surface of the first insulating film 30, a second antioxidant film 42X (refer to FIG. 2) formed of the same material as the lower electrode 42 may also be formed in each partial region of the conductive hydrogen barrier film 32, corresponding to the upper side (directly above each second plug 36) of the second plug 36 in accordance with the same process step as the process step for forming each lower electrode 42.

As shown in FIG. 4(A), a first insulating hydrogen barrier film 41 is formed. The first insulating hydrogen barrier film 41 is formed up to such a range as to cover exposed surfaces of the conductive hydrogen barrier films 32 and ferroelectric capacitor structural bodies 40 lying in the memory cell array area 1 and extend to above the surface 30a of the first insulating film 30 around the ferroelectric capacitor structural bodies 40. The first insulating hydrogen barrier film 41 may preferably be deposited as, for example, a film of 50 nm-thick aluminum oxide by the conventional known sputter method or CVD method in accordance with the method known per se in the art.

Each ferroelectric capacitor structural body 40 is covered and sealed with the first insulating hydrogen barrier film 41 and the conductive hydrogen barrier film 32 over its entirety.

A second insulating film 43 is grown as shown in FIG. 4(B). The second insulating film 43 is formed over the entire surfaces of the memory cell array area 1 and the logic circuit area 2. That is, the second insulating film 43 is deposited so as to cover the first insulating hydrogen barrier film 41 covering each ferroelectric capacitor structural body 40 and the antioxidant films 32' in the logic circuit area 2.

The second insulating film 43 may be deposited as a silicon oxide film by the CVD method that complies with the method known per se in the art.

Next, first and second metal cell contact holes 48 and 49 (first openings or apertures 41a and second opening or aperture 41b, and third openings or apertures 43a and fourth opening or aperture 43b that communicate with these) extending from the surface of the second insulating film 43 to the ferroelectric capacitor structural bodies 40 are formed by the photolithography process and etching process that comply with the method known per se in the art.

As shown in FIG. 5(A), local wirings 45 respectively including a plurality of wiring sections or portions are formed on the second insulating film 43. As to the formation of each local wiring 45, titanium nitride (TiN) is used as a material and deposited as a film thickness of 200 nm or so, after which it may be formed as a local wiring having arbitrary and suitable wiring patterns by the photolithography process and etching process that comply with the method known per se in the art.

Next, part of the second insulating film 43 is removed by the photolithography process and etching process. Described specifically, the second insulating film 43 lying in the logic circuit area 2 is removed until the antioxidant films 32' are exposed (the surface 30a of the first insulating film 30 is exposed). Simultaneously with it, a partial region or area of the second insulating film 43 lying in the memory cell array area 1 is removed until each end edge portion 41c of the first insulating hydrogen barrier film 41 is exposed. At this time, the width of the exposed end edge portion 41c may preferably be, for example, 150 nm or so as viewed from the end edge. A plane shape of the exposed end edge portion 41c is brought into a closed annular shape.

Next, a second insulating hydrogen barrier film 47 is formed. The second insulating hydrogen barrier film 47 is patterned so as to cover the local wirings 45 and the remaining second insulating film 43 portions and in such a manner that its each end edge portion 47a coincides with the end edge portion 41c of the first insulating hydrogen barrier film 41, which is exposed from the second insulating film 43. That is, the end edge portion 47a of the second insulating hydrogen barrier film 47 is connected to the end edge portion 41c exposed from the second insulating film 43.

If done in this way, then other regions of the local wiring 45 are substantially sealed with the first insulating hydrogen barrier film 41 and the second insulating hydrogen barrier film 47 except for regions brought into contact with the upper electrodes 46. Further, the regions held in contact with the upper electrodes 46 are sealed with the conductive hydrogen barrier film 32 and first insulating hydrogen barrier film 41 which cover the ferroelectric capacitor structural bodies 40. Consequently, since each local wiring 45 is sealed with the conductive hydrogen barrier films 32, first insulating hydrogen barrier film 41 and second insulating hydrogen barrier film 47, that is, it is encapsulated, the local wiring 45 is not brought into contact with a film (layer) which evolves hydrogen. Thus, there is no fear that the local wiring 45 brings hydrogen generated in the manufacturing process to the ferroelectric layers 44 of the ferroelectric capacitor structural bodies 40 connected to the local wiring 45.

The second insulating hydrogen barrier film 47 may preferably be deposited as, for example, a film of about 50 nm-thick aluminum oxide by the conventional known sputter method or CVD method in accordance with the method known per se in the art and patterned by the photolithography process and etching process that comply with the method known per se in the art.

Next, a third insulating film 50 is formed. The third insulating film 50 is formed in areas extending over the memory cell array area 1 and the logic circuit area 2. The third insulating film 50 may be grown and planarized as a silicon oxide film by the CVD method that complies with the method known per se in the art.

As shown in FIG. 5(B), third contact holes 52X are defined in the third insulating film 50 lying in the logic circuit area 2. According to this process, the third contact holes 52X may be made open so as to extend from the surface 50a of the third insulating film 50 to parts of the surfaces 32'a of the antioxidant films 32' by the photolithography process and etching process that comply with the method known per se in the art.

Next, a conductive material such as tungsten or the like is embedded into the third contact holes 52X in accordance with a process similar to the first and second plugs 34 and 36 to thereby form third plugs 52.

Then, a first wiring layer 54 including a plurality of wiring sections or portions 54a is formed. The first wiring layer 54 may preferably be patterned into desired wiring patterns, using a metal material like, for example, aluminum (Al), copper (Cu) or the like by the conventional known deposition process, photolithography process and etching process.

With the first wiring layer 54 as a first layer, the process of forming an interlayer insulating film which covers a wiring layer, via holes defined in the interlayer insulating film, plugs which bury the via holes and are connected to lower wirings, and a further wiring layer connected to the plugs is repeated, whereby a desired multilayered wiring structure may be formed.

A fourth insulating film 60 is formed on the third insulating film 50 so as to cover the first wiring layer 54. The fourth insulating film 60 may be formed under conditions similar to those for the third insulating film 50. A via hole 62X extending from the surface of the fourth insulating film 60 to the first wiring layer 54 is formed. The via hole 62X is buried to form a fourth plug 62.

A second wiring layer 64 including a plurality of wiring sections or portions is formed on a top face 62a of the fourth plug 62 and the fourth insulating film 60. The second wiring layer 64 may be formed in a manner similar to the first wiring layer 54. Further, a fifth insulating film 70 that covers the second wiring layer 64 is formed by a material and a process similar to those for the third insulating film 50.

Thereafter, the wafer is brought into fractionization by being diced along unillustrated scribe lines, using the conventional known dicing device.

Thus, a plurality of the ferroelectric memory devices 100 respectively having shapes or configurations of so-called semiconductor chips and the same structure can be manufactured from one wafer 11.

While the preferred forms of the present invention have been described, it is to be understood that modifications will be apparent to those skilled in the art without departing from the spirit of the invention. The scope of the invention is to be determined solely by the following claims.

What is claimed is:

1. A ferroelectric memory device comprising:
a semiconductor substrate having a memory cell array area and a logic circuit area;
a first insulating film in the memory cell array area and the logic circuit area;
a plurality of first plugs which extend through the first insulating film in the memory cell array area;
a plurality of second plugs which extend through the first insulating film in the logic circuit area;
a plurality of conductive hydrogen barrier films over the first insulating film so as to individually cover top faces of the plurality of first plugs, the conductive hydrogen barrier films having end edge portions;
ferroelectric capacitor structural bodies over parts of the plurality of conductive hydrogen barrier films lying in the memory cell array area, each of said ferroelectric capacitor structural bodies are a lamination including a lower electrode, a ferroelectric layer and an upper electrode;
a first insulating hydrogen barrier film over the first insulating film in the memory cell array area so as to cover the ferroelectric capacitor structural bodies and the conductive hydrogen barrier films and so as to be connected with the end edge portions of the conductive hydrogen barrier films, said first insulating hydrogen barrier film having first apertures exposing parts of the upper electrodes and a second aperture exposing part of the corresponding conductive hydrogen barrier film;
a second insulating film over the first insulating hydrogen barrier film and having third apertures communicating with the first apertures and a fourth aperture communicating with the second aperture, wherein end edge portions of the first insulating hydrogen barrier film are exposed from the second insulating film in a closed annular form as exposed portions;
a plurality of local wirings extending over the second insulating film, the plurality of local wirings connecting the upper electrodes exposed from the third apertures and the conductive hydrogen barrier film exposed from the fourth aperture, connecting the upper electrodes to one another and connecting the conductive hydrogen barrier films to one another;
a second insulating hydrogen barrier film over the memory cell array area and so as to be connected with the exposed portions of the first insulating hydrogen barrier film, the plurality of the local wirings and the second insulating film;
a third insulating film which covers the second insulating hydrogen barrier film and the logic circuit area;
third plugs in the logic circuit area and respectively extending through the third insulating film so as to be electrically connected to the second plugs; and
a first wiring layer extending over the third insulating film and including a plurality of wiring portions, said first wiring layer being connected to the third plugs,
wherein the ferroelectric capacitor structural bodies and the plurality of local wirings are sealed by the first and second insulating hydrogen barrier films and the plurality of conductive hydrogen barrier films.

2. The ferroelectric memory device according to claim 1, wherein the conductive hydrogen barrier films further cover top faces of the second plugs.

3. The ferroelectric memory device according to claim 1, wherein each of the conductive hydrogen barrier films is a film of titanium aluminum nitride.

4. The ferroelectric memory device according to claim 2, wherein each of the conductive hydrogen barrier films is a film of titanium aluminum nitride.

5. A ferroelectric memory device comprising:
a first insulating layer having first and second conductive plugs extending therethrough, faces of the first and second conductive plugs are exposed from the first insulating layer;
conductive hydrogen barrier films on the faces of the first and second conductive plugs;
a plurality of capacitor structures over the first insulating layer, the capacitor structures each including a lamination of a top electrode, a ferroelectric film and a bottom electrode, wherein the bottom electrodes are on the conductive hydrogen barrier films that are on the first conductive plugs;
a first hydrogen barrier film on the first insulating layer and the capacitor structures, and directly covering end edge portions of the conductive hydrogen barrier films;
a first insulating film on the first hydrogen barrier film, end edge portions of the first hydrogen barrier film exposed from the first insulating film;
a plurality of local wirings on the first insulating film, the local wirings extending through the first hydrogen barrier film and the first insulating film to be in contact with at least one of the conductive hydrogen barrier films on the second conductive plugs and to be in contact with at least one of the top electrodes;

a second hydrogen barrier film directly on the end edge portions of the first hydrogen barrier film, the first insulating film, and the plurality of local wirings; and a second insulating layer over the second hydrogen barrier film and on the first insulating layer, wherein the capacitor structures and the local wirings are enveloped by the first and second hydrogen barrier films and the conductive hydrogen barrier films.

6. The ferroelectric memory device according to claim 5, wherein the conductive hydrogen barrier films are titanium aluminum nitride.

* * * * *